(12) United States Patent
San Roman Alerigi

(10) Patent No.: US 11,604,323 B2
(45) Date of Patent: Mar. 14, 2023

(54) METHODS TO HARVEST ELECTROMAGNETIC ENERGY DURING SUBSURFACE HIGH POWER LASER TRANSMISSION

(71) Applicant: SAUDI ARABIAN OIL COMPANY, Dhahran (SA)

(72) Inventor: Damian Pablo San Roman Alerigi, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 145 days.

(21) Appl. No.: 16/880,354

(22) Filed: May 21, 2020

(65) Prior Publication Data
US 2021/0364716 A1  Nov. 25, 2021

(51) Int. Cl.
- *G02B 6/42* (2006.01)
- *E21B 7/15* (2006.01)
- *E21B 41/00* (2006.01)
- *G02B 6/02* (2006.01)
- *H01L 27/30* (2006.01)

(Continued)

(52) U.S. Cl.
CPC ............ *G02B 6/4296* (2013.01); *E21B 7/15* (2013.01); *E21B 41/0085* (2013.01); *G02B 6/02* (2013.01); *H01L 27/304* (2013.01); *H01L 51/426* (2013.01); *H01L 51/4253* (2013.01); *H01L 51/447* (2013.01)

(58) Field of Classification Search
CPC .......... G02B 6/4296; G02B 6/02; E21B 7/15; E21B 41/0085; H01L 27/304; H01L 51/426; H01L 51/442; H01L 51/447; H01L 51/4253; Y02E 10/549; H02J 50/30
See application file for complete search history.

(56) References Cited

U.S. PATENT DOCUMENTS

| | | | |
|---|---|---|---|
| 2008/0047599 A1* | 2/2008 | Buller | H01L 31/0475 257/E27.125 |
| 2009/0173372 A1* | 7/2009 | Carroll | H01L 27/301 136/262 |

(Continued)

FOREIGN PATENT DOCUMENTS

| | | |
|---|---|---|
| DE | 102010021648 A1 | 1/2011 |
| EP | 2731209 A1 | 5/2014 |

(Continued)

OTHER PUBLICATIONS

Pali, Inverted P3HT:PCBM organic solar cells on low carbon steel substrates, Solar Energy 133, 2016, 339-348 (Year: 2016).*

(Continued)

*Primary Examiner* — Devina Pillay
(74) *Attorney, Agent, or Firm* — Osha Bergman Watanabe & Burton LLP (57) ABSTRACT

An optical fiber includes an optical fiber core for high-power laser transmission, an optical cladding disposed radially around the optical fiber core, and at least one harvesting cell disposed axially along the optical fiber core, the harvesting cell including an anode surrounding the optical cladding, a photovoltaic layer having a polymer-based photovoltaic material disposed radially around and electrically connected to the anode, and a cathode disposed radially around the photovoltaic layer and electrically connected to the photovoltaic layer.

15 Claims, 8 Drawing Sheets

(51) Int. Cl.
*H01L 51/42* (2006.01)
*H01L 51/44* (2006.01)

(56) References Cited

U.S. PATENT DOCUMENTS

| | | | |
|---|---|---|---|
| 2010/0200044 A1* | 8/2010 | Zaban | H01L 31/0549 136/246 |
| 2010/0313944 A1 | 12/2010 | Curran et al. | |
| 2010/0326503 A1 | 12/2010 | Wang et al. | |
| 2012/0192916 A1 | 8/2012 | Wenxu et al. | |
| 2013/0133744 A1 | 5/2013 | Etienne et al. | |
| 2014/0077324 A1* | 3/2014 | Matsugai | H01L 27/14618 257/432 |
| 2015/0255657 A1 | 9/2015 | Farahi | |
| 2017/0275960 A1 | 9/2017 | Linetskiy | |
| 2019/0157486 A1 | 5/2019 | Wang et al. | |
| 2019/0187378 A1 | 6/2019 | Hiller | |
| 2019/0243067 A1 | 8/2019 | Hiller | |
| 2019/0249314 A1 | 8/2019 | Chen et al. | |
| 2020/0067003 A1 | 2/2020 | Cominetti et al. | |

FOREIGN PATENT DOCUMENTS

| | | |
|---|---|---|
| EP | 3563032 A1 | 11/2019 |
| GB | 2440366 A | 1/2008 |
| KR | 20120010776 A | 2/2012 |
| WO | 2006/130920 A1 | 12/2006 |
| WO | 2016/203012 A1 | 12/2016 |

OTHER PUBLICATIONS

Li, The Optics of Organic Photovoltaics: Fiber-Based Devices, IEEE Journal of Selected Topics in Quantum Electronics, vol. 16, No. 6, Nov./Dec. 2010 (Year: 2010).*
International Search Report issued in International Application No. PCT/US2020/038918, dated Dec. 23, 2020 (6 pages).
Written Opinion issued in International Application No. PCT/US2020/038918, dated Dec. 23, 2020 (8 pages).
Coakley, Kevin M. and Michael D. McGehee. 2004. "Conjugated polymer photovoltaic cells." Chemical Materials, 4533-4542 (10 pages).
Zimmerman, Jeramy D., "Porphyrin-Tape/C 60 Organic Photodetectors with 6.5% External Quantum Efficiency in the Near Infrared" Advanced Materials, 2010,22, 2780-2783 (5 pages).
Wei Wang et al., "Fused Hexacyclic Nonfullerene Acceptor with Strong Near-Infrared Absorption for Semitransparent Organic Solar Cells with 9.77% Efficiency" Advanced Materials, 2017, 1701308 (8 pages).
Huang, Z. et al., "Hybrid Molecule Nanocrystal Photon Upconversion Across the Visible and Near-Infrared" ACS Publications, Nano Letter 2015, 15, 5552-5557 (6 pages).
Li, Gang et al., "High-efficiency solution processable polymer photovoltaic cells by self-organization of polymer blends" Nature Publishing Group, Nature materials, vol. 4, pp. 864-868, Nov. 2005 (5 pages).
Liming Wang et al., "Polymer composites-based thermoelectric materials and devices." Composites Part B; Published Apr. 27, 2017 (11 pages).

* cited by examiner

METHODS TO HARVEST ELECTROMAGNETIC ENERGY DURING SUBSURFACE HIGH POWER LASER TRANSMISSION

BACKGROUND

Wellbore stimulation is a branch of petroleum engineering focused on ways to enhance the flow of hydrocarbons from a formation to the wellbore for production. To produce hydrocarbons from the targeted formation, the hydrocarbons in the formation need to flow from the formation to the wellbore in order to be produced and flow to the surface. The flow from the formation to the wellbore is carried out by the means of formation permeability. When formation permeability is low, stimulation is applied to enhance the flow. Stimulation can be applied around the wellbore and into the formation to build a network in the formation.

One method of well-bore stimulation uses a downhole laser tool to penetrate and ablate a hydrocarbon bearing formation. In such a system, a laser surface unit excites energy to a level above the sublimation point of hydrocarbon bearing formation to form a high power laser beam. This high powered laser beam is transmitted from the laser surface unit to the desired downhole location via fiber optic cable. At the downhole end of the fiber optic cable, the laser beam enters a transformer, which directs and focuses the high power laser beam. Finally, the high power laser beam is discharged from the transformer to ablate the intended hydrocarbon bearing formation.

Figure 1:
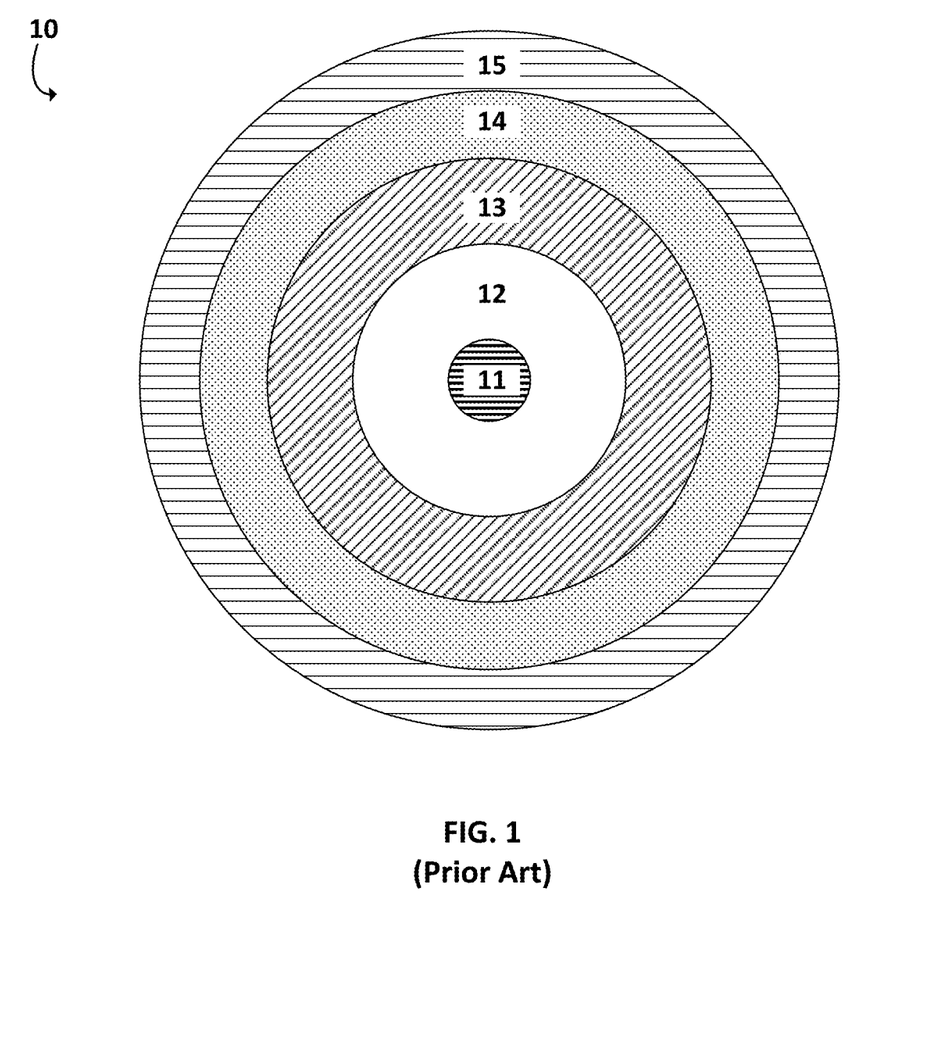
FIG. 1 shows a cross-sectional view along a radial plane through a conventional optical fiber.

Fiber optic cables are flexible and radiation-transparent waveguides designed to guide and confine the propagation of light. FIG. 1 shows a cross-sectional view of a typical fiber optic cable 10. There are two key elements: a) core 11, typically made of a dielectric material; and b) cladding 12, a material of lower refractive index (compared to the core) that encloses the core 11. Additionally, fibers often incorporate: c) a buffer layer 13, to isolate the cladding 12 and the core 11 from the environment; d) a sheath 14, a protective layer that serves as coating for the fiber 10, further isolating it from the surrounding medium; and e) a jacket 15, an enclosure that completely isolates the fiber 10.

SUMMARY

In one aspect, embodiments of the present disclosure relate to optical fibers that include an optical fiber core for high-power laser transmission, an optical cladding disposed radially around the optical fiber core, and at least one harvesting cell disposed axially along the optical fiber core, the harvesting cell including an anode surrounding the optical cladding, a photovoltaic layer having a polymer-based photovoltaic material disposed radially around and electrically connected to the anode, and a cathode disposed radially around the photovoltaic layer and electrically connected to the photovoltaic layer.

In another aspect, embodiments of the present disclosure relate to systems including a high-power laser surface unit capable of generating a high-power laser beam having an output power of at least 10 kW, an optical fiber connected to the high-power laser surface unit, and at least one harvesting cell disposed around the optical fiber, the harvesting cell having an anode, a cathode, and a photovoltaic layer disposed adjacent to and electrically connected to the anode and the cathode, where the photovoltaic layer includes at least one conductive polymer.

In yet another aspect, embodiments of the present disclosure relate to methods that include providing an optical fiber extending from a surface of a wellsite to a downhole location, transmitting a high-powered laser through the optical fiber from the surface to the downhole location, and harvesting electromagnetic energy from the optical fiber during transmission of the high-powered laser.

Other aspects and advantages of the invention will be apparent from the following description and the appended claims.

DETAILED DESCRIPTION

Embodiments disclosed herein relate generally to harvesting energy ensuing from linear scattering (optical) and absorbed light (thermal) from an optical fiber. Energy harvested from optical fibers according to embodiments of the present disclosure may be used, for example, to power other downhole devices. Optical fibers disclosed herein may be used in oil and gas or other downhole applications, for example, in a downhole laser tool. Given the depth of a wellbore, a downhole laser tool may include a fiber optic cable that may be many kilometers meters long, such as 5 km, 20 km, or greater. Consequently, there may be moderate amounts of energy lost during transmission of the laser energy through such lengths of the fiber optic cable. Thus, one or more embodiments harvest this energy along a length of the fiber optic cable used in downhole applications. Once generated and collected at various points along the optical fiber, this electricity may be used to power downhole devices in the current or in a different downhole process.

In optical fibers, attenuation from the reduction in intensity of a light beam as it propagates through a medium occurs primarily from scattering and absorption. Linear scattering is a physical phenomenon exhibited by waves when they are deviated from their original trajectory into a path manifold due to localized defects or irregularities in the medium through which they propagate, e.g. particles, or the interface between two materials. Optical power losses due to scattering vary, although the losses may range from 1% per kilometer (%/km) (0.043 decibel per km (dB/km)) for naturally occurring $SiO_2$ up to 50%/km (2.2 dB/km) for fabrication quality $SiO_2$. Linear scattering frequently appears as laser light propagating outside of the optical core, such as in the cladding. Further, linear scattering can also introduce absorption losses.

Absorption occurs when the energy of a photon is absorbed by a material, typically via excitement of electrons within an atom. In this way, the photon's energy is transformed into potential energy in the atom; for example, it becomes thermal energy and heats the material. There are two regimes of absorption: 1) linear absorption, where the energy transfer does not depend on the intensity of the beam, only in its frequency; and 2) non-linear absorption, where absorption decreases with increasing light intensity. Non-linear absorption is often caused by transparency changes of the medium with increased light intensity, resulting in absorption saturation. Optical power losses in conventional silicon oxide ($SiO_2$) optical fibers due to absorption may range from 17%/km (0.74 dB/km) up to 50%/km (2.2 dB/km). Specialty and hollow-core optical fibers also suffer from absorption losses, with the losses ranging from 1%/km (0.043 dB/km) up to 15%/km (0.65 dB/km). Absorption frequently appears as heating along the fiber.

As discussed previously, linear scattering often causes light to divert from the core of an optical fiber and propagate into the surrounding materials such as the cladding and beyond. According to embodiments of the present disclosure, one or more harvesting cells made of a photovoltaic material may be applied around a fiber core in order to harvest radiant energy from scattered light from the core and generate electricity.

Fundamentally, a photovoltaic device (like a harvesting cell of this disclosure) is an electrical device that converts light or other radiant energy, in the range from ultraviolet to infrared radiation, incident on its surface into electrical energy in the form of power/voltage/current that has two electrodes, an anode and a cathode with opposite electrical polarities.

Light that is incident onto the photovoltaic harvesting cell passes into the active photovoltaic material. If the light is absorbed by the photovoltaic material, the light may generate electrons and holes in the photovoltaic material. The electrons and holes are used to create an electric potential and/or an electric current that may be drawn from the photovoltaic device and applied to an external electric load. The photovoltaic harvesting cell may produce direct current, which flows through the electrodes.

Photons in the light excite electrons in the photovoltaic material and cause the electrons to separate from atoms in the photovoltaic material. In order for the photons to excite the electrons and cause the electrons to separate from the atoms in the photovoltaic material, the photons must have an energy that exceeds the energy band gap in the photovoltaic material. The energy of the photons is related to the wavelengths of light that is incident on the photovoltaic material. Therefore, light is absorbed by the photovoltaic material based on the energy band gap of the photovoltaic material and the wavelengths of the light.

Figure 2A:
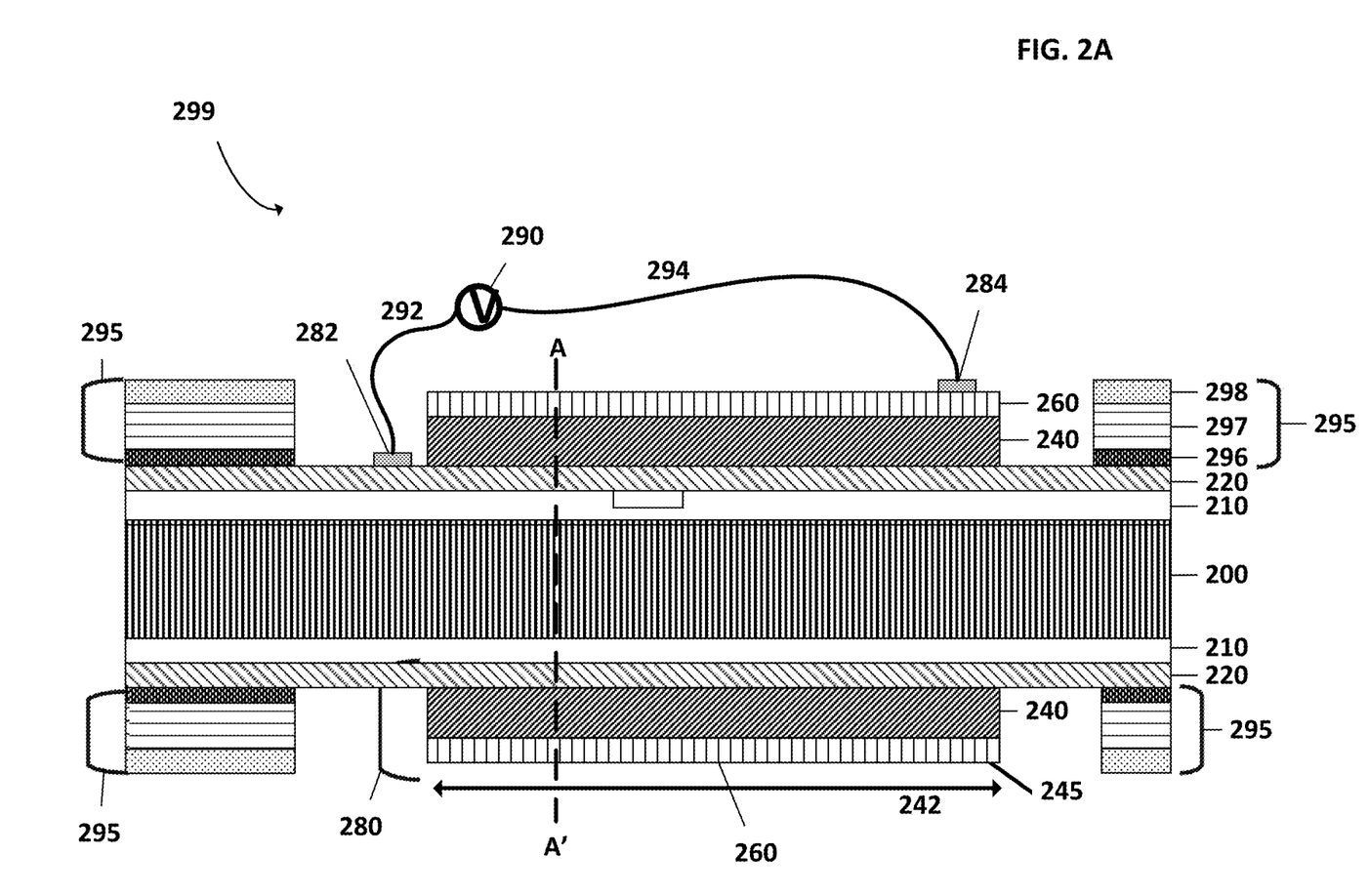
FIGS. 2A and 2B show cross-sectional views along an axial plane and radial plane, respectively, through an optical fiber according to embodiments of the present disclosure.
Figure 2B:
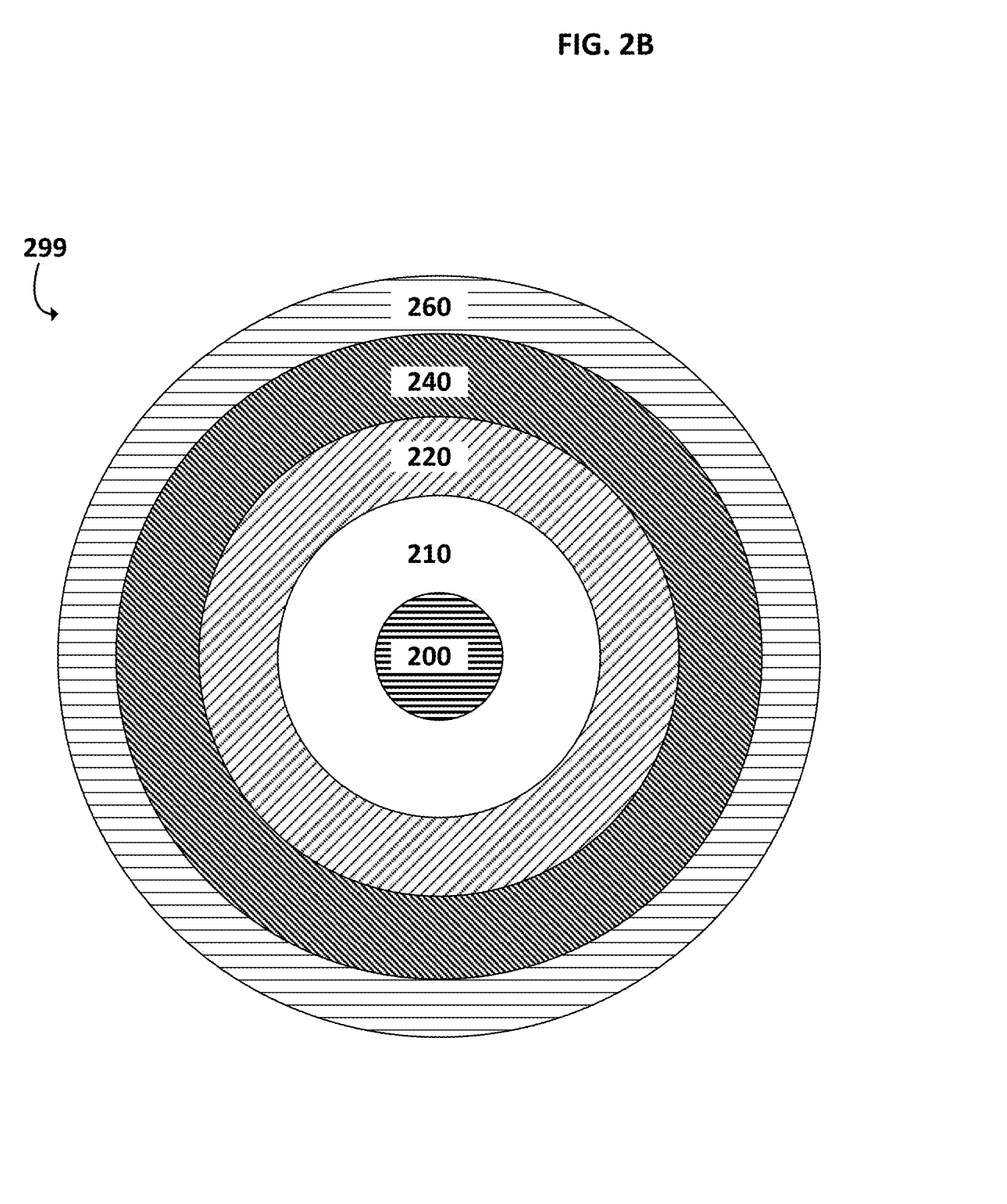

FIG. 2A depicts one embodiment of a harvesting cell 280 provided along an optical fiber 299 that uses the photovoltaic effect to generate electric current. FIG. 2B depicts a cross section of the optical fiber 299 of FIG. 2A between A and A'. The optical fiber 299 includes an optical fiber core 200 and an optical cladding 210 surrounding the core 200. The cladding 210 may be disposed around and cover the entire outer perimeter of the core 200. The core 200 may be made of a dielectric material or material suitable for transmitting a high-power laser. In some embodiments, the core 200 may be formed of a glassy material such as silica glass, flouride glass, phosphate glass, fluorozirconate, fluoroaluminate, or chalcogenide glass. In some embodiments, the core 200 may be formed of a crystalline material such as silicon dioxide or sapphire (aluminum oxide).

The cladding 210 may be made of a material having a lower refractive index than the core 200. In some embodiments, the cladding 210 may be made of a semiconducting material. In some embodiments, the cladding may be formed from the same material as the core but with a slightly altered composition to adjust the refractive index. In some embodiments, the cladding 210 may be formed of a glassy material such as silica glass, flouride glass, phosphate glass, fluorozirconate, fluoroaluminate, or chalcogenide glass. In some embodiments, the cladding 210 may be formed of a crystalline material such as silicon dioxide or sapphire (aluminum oxide). The refractive index difference between core 200 and cladding 210 may be substantially one percent or may be less than one percent (for example, 0.75%, 0.5%, or 0.25%, and ranges in-between).

According to embodiments of the present disclosure, the core 200 and cladding 210 sizes may be designed for transmission of a high power laser (for example, a laser having an output power of at least 10 kW, at least 20 kW, at least 100 kW, or in the megawatt range). For example, the core 200 may have a thickness (diameter) ranging from about 50 to 900 micrometers, and the cladding 210 may have a thickness, as measured from the outer perimeter of the core 200 to the outer perimeter of the cladding 210, ranging from about 50 micrometers to about 1 millimeter. Further, the length of the optical fiber 299, depending on the application, fabrication and material design, may reach several kilometers.

At least one harvesting cell 280 may be disposed around the optical cladding 210. The harvesting cell 280 includes an anode 220, a photovoltaic layer 240 disposed adjacent to and electrically connected to the anode 220, and a cathode 260 disposed adjacent to and electrically connected to photovoltaic layer 240. In the embodiment shown, the anode 220, photovoltaic layer 240, and cathode 260 are in a layered arrangement where the photovoltaic layer 240 is sandwiched between the anode 220 and cathode 260. The anode 220 may extend a partial or entire length of the optical fiber 200 and extend radially partially or entirely around the outer perimeter of the optical cladding 210. The photovoltaic layer 240 may extend a partial length of the optical fiber 200 and extend radially partially or entirely around the outer perimeter of the anode 220. Further, the cathode 260 may extend a partial length of the optical fiber 200 and extend radially partially or entirely around the outer perimeter of the photovoltaic layer 240.

An anode 220 may be made of a p-type semiconductor. The p-type semiconductor may serve as an electron donor. In the embodiment shown, the anode 220 is a layer adjacent to the optical cladding 210. In some embodiments, the optical cladding 210 may be formed from a p-type semiconductor and serves as the anode (where the cladding and anode are the same layer). The anode 220 may be optically transparent or semi-transparent to allow light scattered from core 200 to reach photovoltaic layer 240.

In some embodiments, the anode 220 may be formed from a transparent conducting film. Some potential transparent conducting films for anode 220 include transparent conducting oxides (for example, indium tin oxide (ITO), fluoride doped tin oxide (FTO), doped zinc oxide, and doped $SiO_2$ (for example, ytterbium-doped $SiO_2$ ($Yb:SiO_2$)), metal grids and random metallic networks, conductive polymers (for example, polyacetylene, polyaniline, polypyrrole, polythiophenes, and their derivatives), carbon nanotubes, graphene, nanowire meshes, and ultra-thin metal films (for example, silver (Ag), gold (Au), platinum (Pt), palladium (Pd), and nickel (Ni)).

In some embodiments, the refractive index of anode 220 may be substantially equal to the refractive index of cladding 210. "Substantially" means within ±0.10%, within ±0.05%, or within ±0.01%. Substantially equal refractive indices for anode 220 and cladding 210 allows light to readily pass from cladding 210 into anode 220. In one or more embodiments, anode 220 may have a higher refractive index than cladding 210, so light is not refracted back into cladding 210 at the anode 220/cladding 210 interface.

In some embodiments, the anode 220 may be formed of a material with high electrical conductivity. Material with a "high" electrical conductivity may refer to material having electrical conductivity, for example, greater than 10 S cm$^{-1}$. In some embodiments, the anode 220 may be formed of a material with a high work function. Material with a "high" work function may refer to material having a work function greater than, for example, 4.5 eV.

In some embodiments, a photovoltaic layer 240 may be formed of a single material. Such a single material may be a p-type photovoltaic polymer, in some embodiments. In some embodiments, the single material may be an electron donor. In some embodiments, the acceptor may comprise at least one photovoltaic polymer selected from 5;5'-bis[(4-(7-hexylthiophene-2-yl)thiophene-2-yl)-[1,2,5]thiadiazole[3,4-c]pyrimidin]-3;3'-di-2-ethylhexylsilylene-2;2'bithiophene (DTS(PTTh2)2), poly(3-hexylthiophene) (P3HT), poly[[9-(1-octylnonyl)-9H-carbazol-2,7-diyl]-2,5-thiophenediyl-2,1,3-benzothiadiazole-4,7-diyl-2,5-thiophenediyl] (PCDTBT), Poly[2,6-(4,4-bis-(2-ethylhexyl)-4H-cyclopenta[2,1-b;3,4-b']dithiophene)-alt-4,7(2,1,3-benzothiadiazole)] (PCPDTBT), polybis(thienyl)thienodia-thiazolethiophene (PDDTT), Poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)] (PffBT4T-2OD), or Poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}) (PTB7-Th). In some embodiments, when using a single material photovoltaic layer 240, anode 220 or cladding 210 may serve as the electron acceptor.

In some embodiments, the photovoltaic layer 240 may be formed from more than one material. Those two or more materials may form a heterojunction. In some embodiments, the heterojunction may be formed from at least one donor and at least one acceptor.

In some embodiments, the heterojunction may be ordered. An example of an ordered heterojunction may be a bi-layer cell having an acceptor layer atop a donor layer (with the donor layer adjacent to anode 220 and acceptor layer adjacent to cathode 260). In some embodiments, the anode 220 may serve as the donor. In some embodiments, the heterojunction may be a nanoscale blend of donor and acceptor materials. In some embodiments, the heterojunction may be graded such that the electron donor and acceptor are mixed in a gradual way between anode 220 and cathode 260.

In some embodiments, the donor within the heterojunction may be one or more p-type photovoltaic polymers. In some embodiments, the donor may include at least one photovoltaic polymer selected from 5;5'-bis[(4-(7-hexylthiophene-2-yl)thiophene-2-yl)-[1,2,5]thiadiazole[3,4-c]pyrimidin]-3;3'-di-2-ethylhexylsilylene-2;2'bithiophene (DTS(PTTh2)2), poly(3-hexylthiophene) (P3HT), poly[[9-(1-octylnonyl)-9H-carbazol-2,7-diyl]-2,5-thiophenediyl-2,1,3-benzothiadiazole-4,7-diyl-2,5-thiophenediyl] (PCDTBT), Poly[2,6-(4,4-bis-(2-ethylhexyl)-4H-cyclopenta[2,1-b;3,4-b']dithiophene)-alt-4,7(2,1,3-benzothiadiazole)] (PCPDTBT), polybis(thienyl)thienodia-thiazolethiophene (PDDTT), Poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)] (PffBT4T-2OD), or Poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}) (PTB7-Th).

In some embodiments, the acceptor within the heterojunction may include at least one material selected from fullerenes such as C60 and its derivatives.

In some embodiments, the photovoltaic layer 240 comprises an organic conductive matrix and a nanocrystalline dispersed phase. The nanocrystalline dispersed phase may improve the photovoltaic generation in response to infrared or near-infrared radiation. Such improvement may be made by upconverting two low energy photons into one high energy photon.

In some embodiments, the organic conductive matrix may include at least one photovoltaic polymer selected from 5;5'-bis[(4-(7-hexylthiophene-2-yl)thiophene-2-yl)-[1,2,5]thiadiazole[3,4-c]pyrimidin]-3;3'-di-2-ethylhexylsilylene-2;2'bithiophene (DTS(PTTh2)2), poly(3-hexylthiophene) (P3HT), poly[[9-(1-octylnonyl)-9H-carbazol-2,7-diyl]-2,5-thiophenediyl-2,1,3-benzothiadiazole-4,7-diyl-2,5-thiophenediyl] (PCDTBT), Poly[2,6-(4,4-bis-(2-ethylhexyl)-4H-cyclopenta[2,1-b;3,4-b']dithiophene)-alt-4,7(2,1,3-benzothiadiazole)] (PCPDTBT), polybis(thienyl)thienodia-thiazolethiophene (PDDTT), Poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)] (PffBT4T-2OD), or Poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}) (PTB7-Th).

In some embodiments, the nanocrystalline dispersed phase may include at least nanoparticle selected from CdSe, PbS, PbSe, fullerenes, Ni, NiCo, NiLa, NiS, NiLu, PbSe, an aminium radical cation, an anionic borate moiety, oxide semiconductor fine particles sensitized with a dye, triply linked porphyrin-tape dimers, fused hexacyclic nonfullerene acceptor, and IHIC.

In some embodiments, narrowband sources (such as a laser) may be transmitted in optical core 200. Thus, the materials that form photovoltaic layer 240 may be tuned to absorb energy at the specific bandwidth being transmitted. In some embodiments, the band gap of the photovoltaic layer 240 may be aligned with a wavelength of the radiation scattered from the optical fiber core 200. When the laser beam transmitted through optical fiber core 200 is near-infrared or infrared, the band gap of photovoltaic layer 240 may be between 1.14 and 1.2 eV in some embodiments. One having skill the art will appreciate how to determine a potential band gap for photovoltaic layer 240 given the wavelength of light transmitted through optical core 200.

A cathode 260 may be made of an n-doped carbon or metal compound, such as Aluminum (Al), Cadmium (Cd), or Tellurium (Te). In some embodiments, a cathode 260 may be constructed in layers of the same material with declining doping. Dopants may include, for example, Aluminum (Al), Cadmium (Cd), or Selenide (Se$^{-2}$). The cathode 260 may act as both a shield for the optical fiber and a conductor.

The depicted harvesting cell 280 includes multiple concentric layers surrounding optical fiber core 200 that may augment or replace one or more of the cladding, a buffer layer, a sheath, and a jacket in a conventional fiber optic cable (e.g., shown in FIG. 1). Surrounding optical fiber core

200, in order from the radially center core 200 to the radially outermost part of the optical fiber 299 around the harvesting cell 280, is the cladding 210 surrounding the core 200, the anode 220, the photovoltaic layer 240, and the cathode 260. Additionally, a first contact 282 and wire 292 may be connected to the anode 220 and a second contact 284 and wire 294 may be connected to the cathode 260. The two wires 282, 292 may connect to a voltmeter 290 to close the circuit.

In the embodiment shown, the harvesting cell 280 may be located and axially spaced (e.g., with enough room for a contact 282 and wire 284 to access the anode 220) between portions of concentrically layered protective layers 295 including a buffer layer 296, sheath 297, and/or jacket 298 (where any of the buffer layer 296, sheath 297, and jacket 298 are optional). For example, a conventionally configured optical fiber having a core, a cladding layer disposed radially around the outer surface of the core, and one or more protective layers formed radially around the outer surface of the cladding (e.g., a buffer layer around the cladding, a sheath around the buffer layer, and a jacket around the sheath, or a configuration where the buffer, sheath and/or jacket may be combined or omitted) may have axial portions of the protective layer(s) replaced with one or more harvesting cells 280. In some embodiments, protective layers such as conventionally formed buffer layers, sheaths, and jackets may be entirely absent from around the cladding 210, where harvesting cells 280 may instead be positioned radially surrounding the cladding 210 along a portion or substantially the entire length of the optical fiber 299.

A harvesting cell 280 may have an axial length 242 ranging from the centimeter scale (e.g., 10 cm to 100 cm or more) to the meter scale (e.g., 1 m to 10 m or more). Thus, in embodiments having harvesting cells 280 covering a substantial axial length of an optical fiber 299 for use downhole, which can have axial lengths in the kilometer range, multiple harvesting cells 280 may be disposed along the optical fiber 299. The length of each harvesting cell 280 may vary depending on, for example, the application, fiber length, power requirements, and design parameters.

The harvesting cell 280 may generate electric current from light scattered from an optical fiber core 200. As light propagates through the core 200 of the optical fiber 299, a portion of the electromagnetic radiation will be diffracted into the cladding 210. A polymer-based photovoltaic material used in the photovoltaic layer 240 may generate a voltage difference from the diffracted radiation 235, where the anode 220 and cathode 260 may be positioned at opposite sides of a photovoltaic layer 240 and connected to create a voltage difference. In such manner, photovoltaic energy generation may result from the conversion of electromagnetic radiation into electric potentials.

To improve optical extraction, and enhance harvesting, the cladding 210 can be texturized to increase scattering. For example, the outer surface 215 of the cladding 210 may be modified to have periodic shapes in the formed of relatively raised and lowered portions, including, for example, ribs/ridges and sinusoids. Different techniques may be used to create and optimize a textured outer surface 215 of the cladding 210. By texturizing the outer surface 215 of the cladding 210, the surface area of the outer surface 215 may be increased, which in turn helps to increase the amount of scattering and improve optical extraction.

To improve optical extraction, the harvesting cells 280 may further comprise a reflective cladding (not depicted) surrounding the cathode 260 in some embodiments.

In some embodiments, an optical cavity layer (not depicted) may be radially between photovoltaic layer 240 and cathode 260. Such an optical cavity layer may reflect light back into photovoltaic layer 240. The refractive index of the optical cavity layer may be greater than the refractive index of the organic photovoltaic layer 240. This optical cavity layer may create a cavity for the scattered light, which may improve harvesting. In some embodiments, the optical cavity layer may be formed from a polymeric material.

An optical fiber 299 may have a single harvesting cell 280 or multiple harvesting cells 280 (each harvesting cell 280 including concentric layers of anode 220, photovoltaic material 240, and cathode 260). In some embodiments, multiple harvesting cells 280 may be disposed next to each other (with enough room between the harvesting cells 280 for a contact 282 and wire 292 to access the anode 220), and may be connected in series or parallel (e.g., via electrical circuit connections) depending on the application and length of the optical fiber 299.

Figure 3:
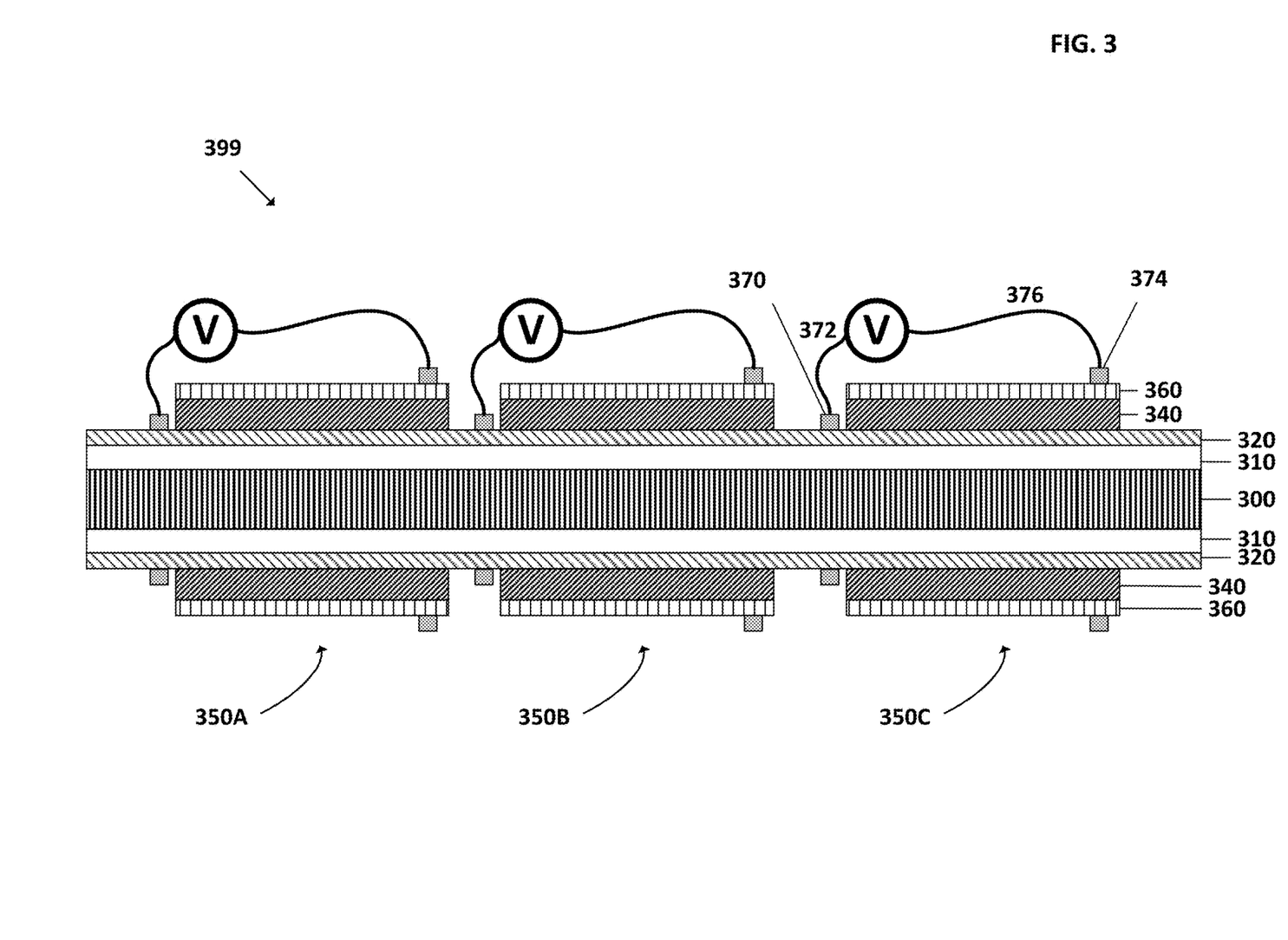
FIG. 3 shows a cross-sectional view along an axial plane through an optical fiber according to embodiments of the present disclosure.

For example, FIG. 3 shows an example of an optical fiber 399 having a plurality of harvesting cells 350A, 350B, 350C (collectively referred to as 350) electrically connected together in parallel. The optical fiber 399 has a core 300 extending axially through its entire length and a cladding 310 disposed radially around the outer surface of the core 300. Multiple harvesting cells 350 may be positioned along the optical fiber 399 at different axial locations, where each harvesting cell 350 is formed of an anode 320 disposed radially around the outer surface of the cladding 310, a photovoltaic layer 340 disposed radially around the anode 320, and a cathode 360 disposed radially around the photovoltaic layer 340. The anode 320 may be a layer of thermally and electrically conducting material that entirely coats the cladding 310, or the anode may be disposed around the cladding 310 in axial sections with the harvesting cells 350 (having spacing between separate anode sections). In either configuration, the anode 320 may be disposed adjacent to and between the optical cladding 310 and the photovoltaic layer 340. Around each harvesting cell 350 a first connector 370 and wire 372 may be electrically connected to the anode 320 and a second connector 374 and wire 376 may be electrically connected to the cathode 360. In other words, as shown in FIG. 3, each harvesting cell 350 has a first connector 370 and wire 372 electrically connected to the anode 320 and a second connector 374 and wire 376 electrically connected to the cathode 360. In such manner, the harvesting cells 350 may be electrically connected in parallel.

Figure 4:
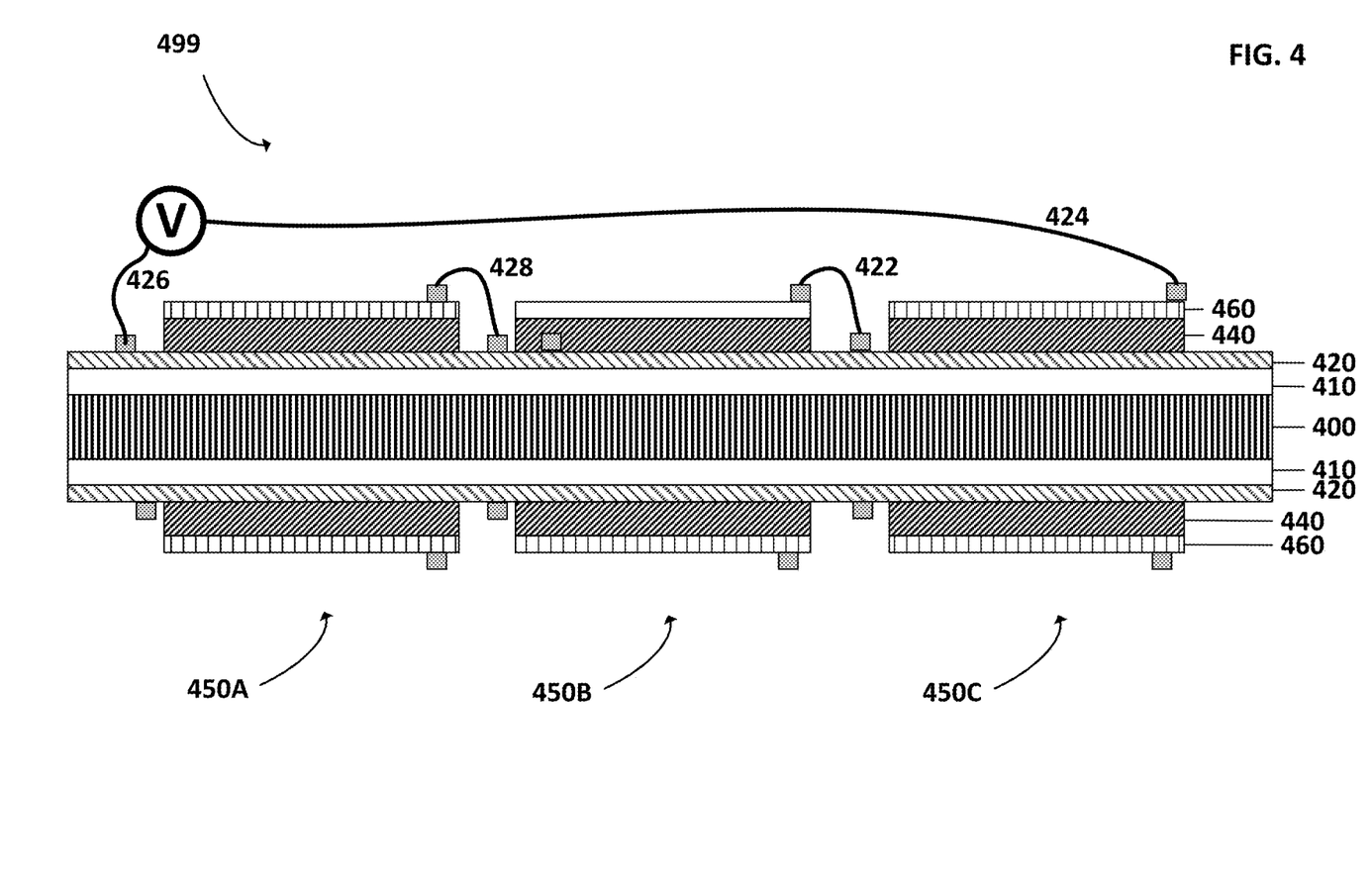
FIG. 4 shows a cross-sectional view along an axial plane through an optical fiber according to embodiments of the present disclosure.

FIG. 4 shows an example of an optical fiber 499 having a plurality of harvesting cells 450A, 450B, 450C (collectively referred to as 450) electrically connected together in series. The optical fiber 499 has a core 400 extending axially through its entire length and a cladding 410 disposed radially around the outer surface of the core 400. Multiple harvesting cells 450 may be positioned along the optical fiber 499 at different axial locations, where each harvesting cell 450 is formed of an anode 420 disposed radially around the outer surface of the cladding 410, a photovoltaic layer 440 disposed radially around the anode 420, and a cathode 460 disposed radially around the photovoltaic layer 440. The harvesting cells 450 may be electrically connected in series, where a first wire 428 may be electrically connected from the cathode 460 on a first harvesting cell 450A to the anode 420, a second wire 422 may be electrically connected from the cathode 460 on a second harvesting cell 450B to the anode 420, and the cathode 460 on a third harvesting cell 450C may be electrically connected to the anode 420 via wires 424, 426.

The circuit between harvesting cells 450 may be closed, where the voltage difference between the anode 420 and cathodes 460 of each harvesting cell 450 may be, for example, stored in batteries or used to power low-power sensors along the optical fiber 499. The electrical power can be used, for example, to manipulate rotors, beam stirrers, and other elements of an optical bottom hole assembly. The performance of polymer heterojunctions and photovoltaic materials may be affected by temperature, pressure, and chemical composition of the environment in which the optical fiber 499 is operating in (e.g., in a downhole environment). Thus, by monitoring the performance of the polymer heterojunctions and photovoltaic materials from the harvesting cells 450, changes in the surrounding environment may be detected in situ, where controlled measurements of the harvesting cells 450 performance may be correlated with various changes in the surrounding environment (such as changes in pressure, temperature or chemical composition).

Other arrangements of harvesting cells may be provided around an optical fiber to harvest electromagnetic energy from scattering as portions of light escape from the fiber's core during transmission of a laser. Harvesting cells, defined by an anode, photovoltaic material, and a cathode, may be arranged along the length of the optical fiber, where the anode and cathode may be positioned around photovoltaic material. For example, an anode, photovoltaic layer, and cathode may be radially layered around a fiber cladding, where the anode and cathode are disposed on opposite sides of a photovoltaic layer.

Figure 5A:
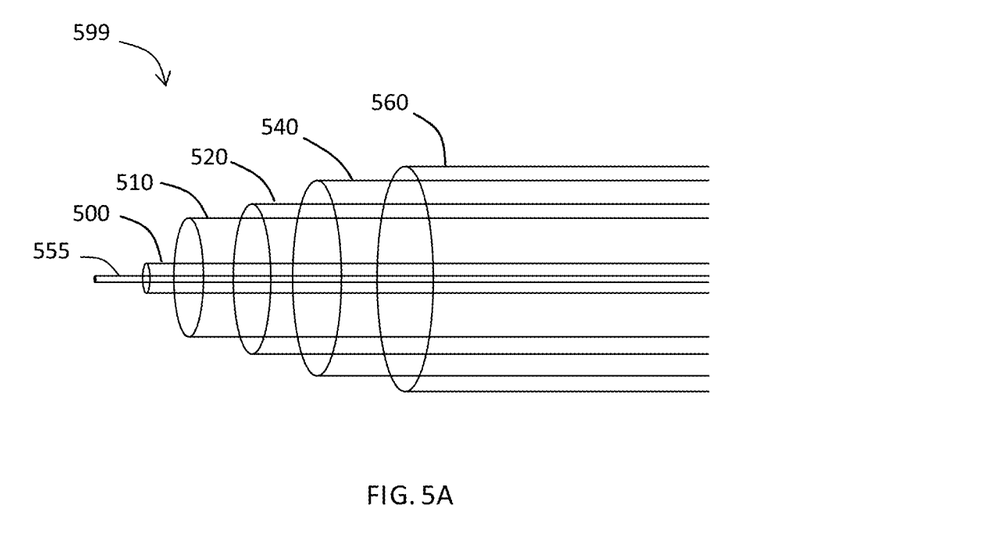
FIG. 5A shows a deconstructed view of an optical fiber according to embodiments of the present disclosure.
Figure 5B:
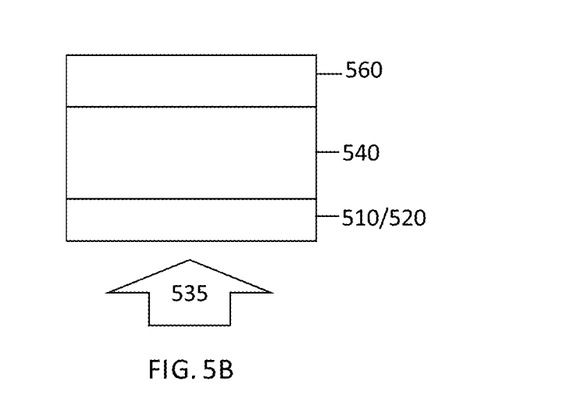
FIG. 5B shows a partial cross-sectional view of the optical fiber shown in FIG. 5A along a radial plane through the optical fiber.

FIGS. 5A and 5B show another example of an optical fiber 599 capable of harvesting electromagnetic energy during a laser 555 transmission through the core 500 of the optical fiber 599. A deconstructed view of the optical fiber 599 is shown in FIG. 5A, and a diagram of the energy harvesting from the optical fiber 599 is shown in FIG. 5B. The optical fiber 599 has an optical core 500, a cladding 510 layered concentrically around the core 500, an anode 520 layered concentrically around the cladding 510, a photovoltaic material 540 layered concentrically around the anode 520, and cathode 560 deposited around the photovoltaic material 540. The anode 520 may be formed of an electrically conductive and optically transparent material, and may be made of the same or different material as the cladding 510. The anode material and cathode material may be electrically connected in such a way that create a single voltage difference across the entire length of the optical fiber 599, or discontinuously providing multiple voltage difference points across the optical fiber 599. As shown in FIG. 5B, as light 535 from the laser is refracted from the optical core 500 through the cladding 510 and anode 520 and into the photovoltaic layer 540, a voltage difference generated from the photovoltaic layer 540 may be collected and stored, for example, in batteries, or used to power one or more downhole devices proximate the optical fiber 599.

Optical fibers disclosed herein may be used in downhole operations for the transmission of high-powered lasers, e.g., laser beams having an output power of at least 10 kW. For example, a laser well-bore stimulation process may require a high-power laser beam in order to penetrate the hydrocarbon bearing formations of interest. This process may require a laser beam having an average optical power output of more than 1 kilowatt (kW) or having a power density of approximately $10^9$ to $10^{15}$ watts per centimeter-squared (W/cm²). A laser beam generator used to generate the laser may include any type of laser unit capable of generating such high-power laser beams that can be conducted through fiber optic cable. A laser beam generator may generate, for example, lasers of ytterbium, erbium, neodymium, dysprosium, praseodymium, and thulium ions. In some embodiments, the laser beam generator may generate a type of fiber laser capable of delivering a laser at a minimum loss through the optical fiber.

The wavelength of a laser beam from a laser beam generator may be set for a selected application, such as for a laser drilling application. For example, the wavelength may correspond to a resonant frequency of a fluid molecule, or a harmonic of that resonant frequency, in applications where contact with the laser beam to a wellbore fluid in a hydrocarbon-bearing formation produces plasma. In some implementations, the wavelength may be between 950 nanometers (nm) and 1000 nm. In some implementations, the wavelength may be between 960 nm and 980 nm. In some implementations, the wavelength is set to a principal resonant frequency of water.

In some embodiments, an optical fiber according to embodiments of the present disclosure may be run through downhole tubing (e.g., within the wall of the tubing), which may be used in a downhole operation such as drilling.

Figure 6A:
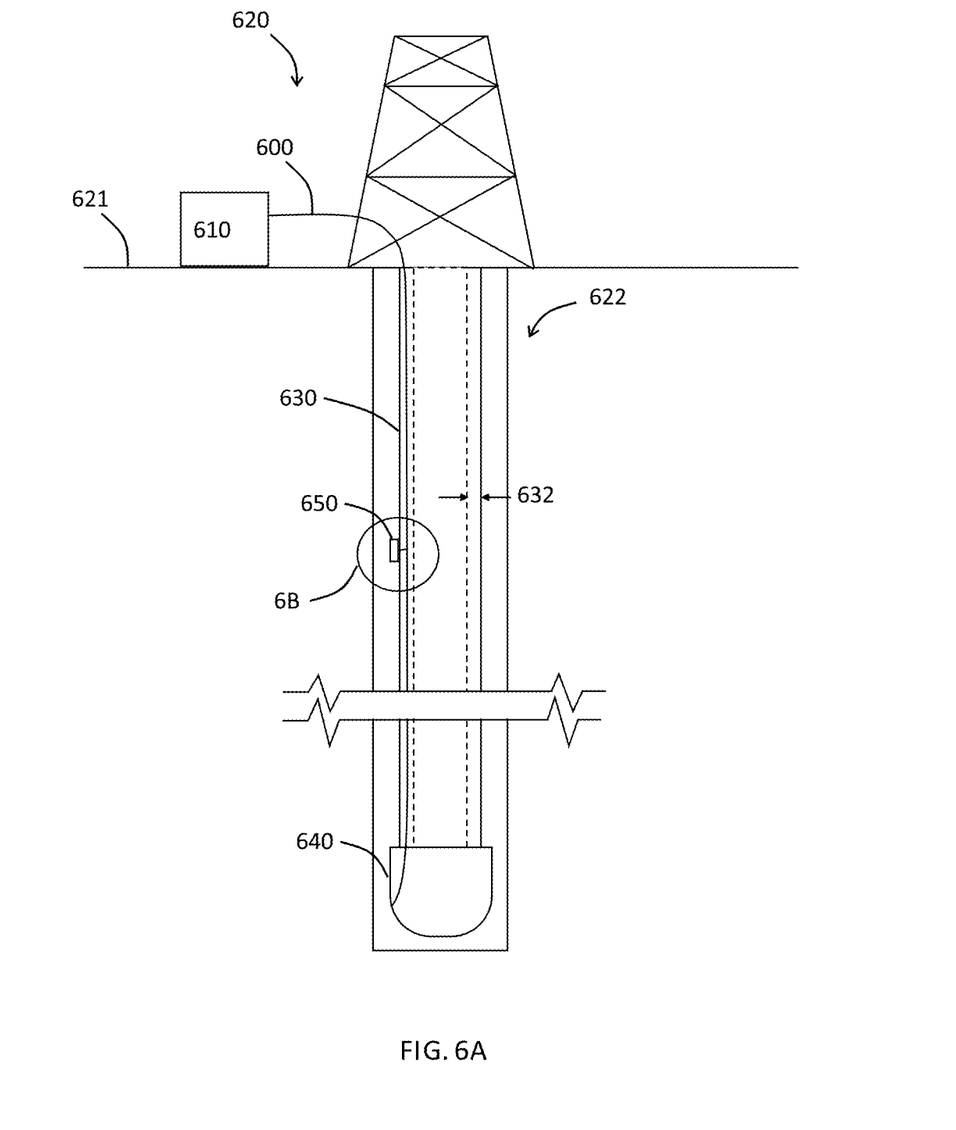
FIG. 6A shows a system using an optical fiber according to embodiments of the present disclosure.

FIG. 6 shows an example of a system using an optical fiber 600 according to embodiments of the present disclosure. The system may include a laser beam generator 610 such as a high-power laser surface unit capable of generating a high-power laser beam, e.g., laser beams having an output power of at least 10 kW. In some implementations, a laser beam generator 610 can be any type of laser generator configured to output a laser beam at a minimum loss. The laser beam generator 610 may be external to a wellbore, for example, at the surface 621 of a wellsite 620 outside of the well 622.

Figure 6B:
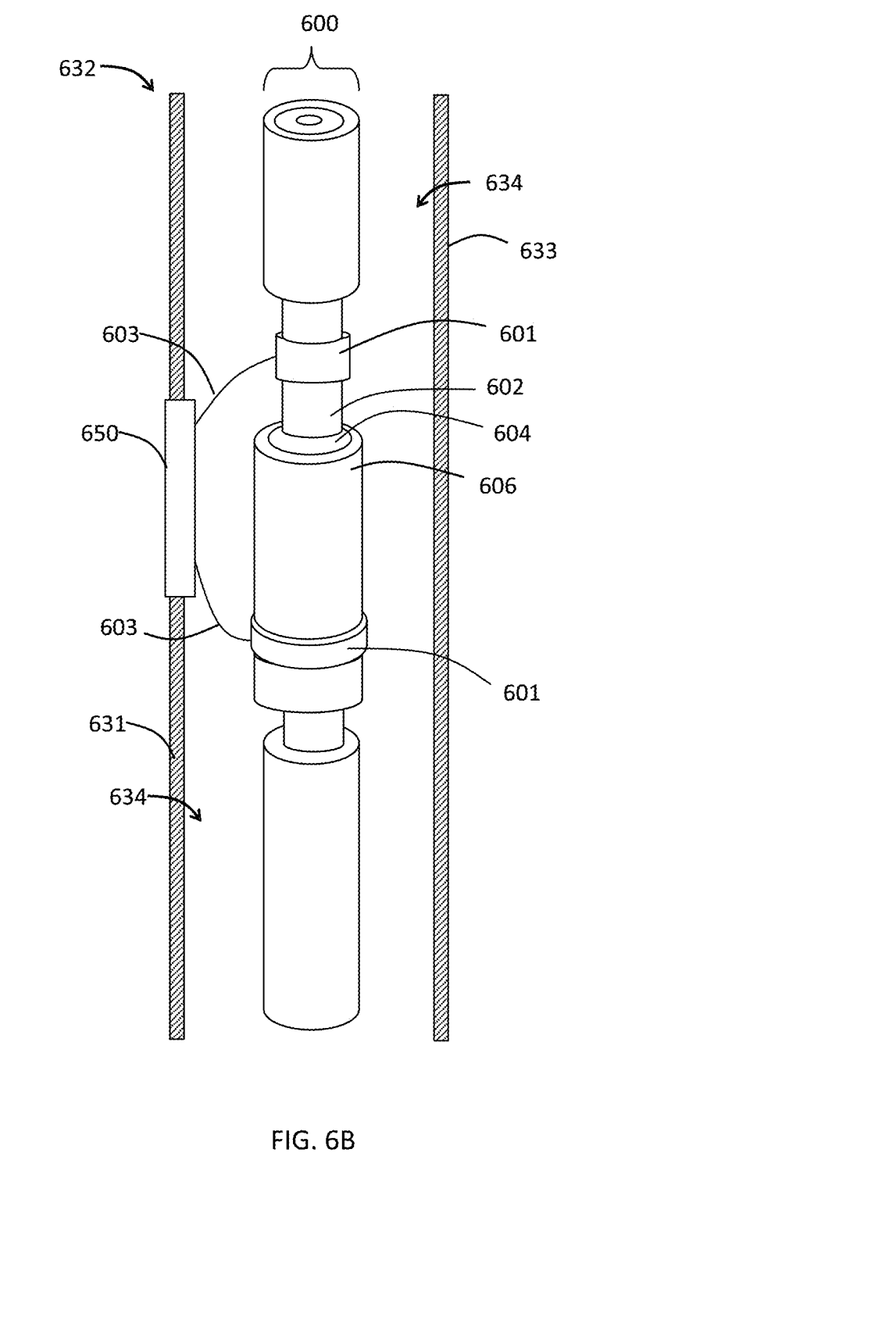
FIG. 6B shows a zoomed in view of the optical fiber in the system of FIG. 6A.

An optical fiber 600 according to embodiments disclosed herein may be connected to the laser beam generator 610, where the optical fiber 600 may be formed of an optical cladding surrounding an optical fiber core and at least one harvesting cell disposed around the optical fiber (e.g., such as described with reference to FIGS. 2A-5B). For example, as best shown in FIG. 6B, a harvesting cell may include an anode 602, a cathode 606, and a photovoltaic layer 604 disposed adjacent to and between the anode 602 and cathode 606.

The optical fiber 600 may extend from the laser beam generator 610 at the surface 621 of the wellsite 620 to a downhole location. For example, in a laser drilling operation, the optical fiber 600 may extend to the bottom of the well 622, and may be integrated with or attached to a downhole drilling device 640 for drilling the well 622.

In some embodiments, the optical fiber 600 may extend downhole through the wall 632 of downhole tubing 630 (e.g., coiled tubing). As best shown in FIG. 6B, the wall 632 of a tubing 630 may be formed of an outer wall 631 and an inner wall 633, where a gap or spacing 634 may be provided between the outer wall 631 and the inner wall 633. The spacing 634 may form a conduit through which the optical fiber 600 may extend from the surface 631 along the entire axial length of the tubing 630. In some embodiments, high-pressure gas such as $N_2$ or $O_2$ may be injected into the spacing 634 around the optical fiber 600.

Electrical connections, including, for example, contacts 601 around the anode 602 and cathode 606 and wires 603 may be electrically connected to one or more harvesting cells disposed along the optical fiber 600. The electrical connections 601, 603 may electrically connect the harvesting cell(s) of the optical fiber 600 to an external circuit, such as one in a downhole device 650 to provide power to the downhole device(s) 650.

A downhole device 650 powered by electromagnetic energy harvesting from the optical fiber 600 may include, for example, a downhole sensor, e.g., temperature sensor, pressure sensor, flow meter, or any other sensor that may monitor a downhole condition. In this manner, optical fibers 600 according to embodiments of the present disclosure may provide power to one or more components downhole from transmission of a laser through the optical fiber 600. In the embodiment shown, the downhole device 650 may be a sensor positioned along the outer wall 631 of the tubing wall 632, such that the sensor may detect one or more conditions of the downhole environment surrounding the tubing 630.

According to embodiments of the present disclosure, methods of electromagnetic energy harvesting during a downhole operation may include providing an optical fiber 600 extending from a surface 621 of a wellsite 620 to a downhole location (e.g., through downhole tubing or other conduit), transmitting a high-powered laser through the optical fiber 600 from the surface 621 to the downhole location, and harvesting electromagnetic energy from the optical fiber 600 during transmission of the high-powered laser. Electromagnetic energy may be harvested from the optical fiber 600 using harvesting cells (formed of an anode 602, photovoltaic layer 604, and cathode 606) disposed along the length of the optical fiber 600. A voltage difference may be generated from the photovoltaic layer 604 in the harvesting cell(s), and the voltage may be used to power one or more downhole devices 650, depending on, for example, the power requirements for operation of the downhole device and the amount and size of the harvesting cell(s) used to power the downhole device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An optical fiber, comprising:
   an optical fiber core;
   an optical cladding disposed radially around the optical fiber core;
   at least two harvesting cells that are discontinuous and disposed axially along the optical cladding to harvest energy lost during the high-power laser transmission, each harvesting cell comprising:
   an anode surrounding the optical cladding;
   a photovoltaic layer comprising a polymer-based photovoltaic material disposed radially around and electrically connected to the anode; and
   a cathode disposed radially around the photovoltaic layer and electrically connected to the photovoltaic layer,
   wherein the photovoltaic layer is adapted to convert the energy lost into a voltage difference, and
   an electrical connection connecting the anode of a first one of the at least two harvesting cells and the cathode of a second one of the at least two harvesting cells to combine respective voltage differences,
   wherein the optical fiber has a length exceeding 1 kilometer.

2. The optical fiber of claim 1, further comprising:
   a first contact electrically connected to the anode of the second one of the at least two harvesting cells; and
   a second contact electrically connected to the cathode of the first one of the at least two harvesting cells.

3. The optical fiber of claim 1, wherein the optical cladding is texturized to form resonators.

4. The optical fiber of claim 1, wherein a band gap of the photovoltaic layer is aligned with a wavelength of scattered radiation from the optical fiber core.

5. The optical fiber of claim 1, wherein the cathode comprises an n-doped carbon or metal compound.

6. The optical fiber of claim 1, wherein each of the at least two harvesting cells further comprises an optical cavity layer disposed between the photovoltaic layer and the cathode, where a refractive index of the optical cavity layer is greater than a refractive index of the photovoltaic layer.

7. The optical fiber of claim 1, wherein each of the at least two harvesting cells further comprises a reflective cladding surrounding the cathode.

8. The optical fiber of claim 1,
   wherein an output power of the optical fiber exceeds 10 kilowatts,
   wherein the optical fiber core has a diameter ranging from 50 micrometers to 900 micrometers, and
   wherein the optical cladding has a thickness ranging from 50 micrometers to 1 millimeter.

9. The optical fiber of claim 1,
   wherein the optical cladding comprises at least one of indium tin oxide, fluoride doped tin oxide, doped zinc oxide, and ytterbium-doped silicon dioxide.

10. The optical fiber of claim 1, wherein the anode comprises a p-type transparent conducting film surrounding the optical cladding.

11. The optical fiber of claim 10, wherein the anode comprises yttrbium-doped $SiO_2$ ($Yb:SiO_2$) or indium tin oxide (ITO).

12. The optical fiber of claim 1, wherein the polymer-based photovoltaic material comprises a heterojunction of a donor and an acceptor.

13. The optical fiber of claim 12, wherein the donor is selected from at least one of 5;5'-bis[(4-(7-hexylthiophene-2-yl)thiophene-2-yl)-[1,2,5]thiadiazole[3,4-c]pyrimidin]-3; 3'-di-2-ethylhexylsilylene-2;2'bithiophene (DTS(PTTh2)2), poly(3-hexylthiophene) (P3HT), poly[[9-(1-octylnonyl)-9H-carbazol-2,7-diyl]-2,5-thiophenediyl-2,1,3-benzothiadiazole-4,7-diyl-2,5-thiophenediyl] (PCDTBT), Poly[2,6-(4, 4-bis-(2-ethylhexyl)-4H-cyclopenta[2,1-b;3,4-b'] dithiophene)-alt-4,7(2,1,3-benzothiadiazole)] (PCPDTBT), polybis(thienyl)thienodia-thiazolethiophene (PDDTT), Poly [(5,6-difluoro-2,1,3-benzothiadiazol-4,7-diyl)-alt-(3,3'''-di (2-octyldodecyl)-2,2';5',2'';5'',2'''-quaterthiophen-5,5'''-diyl)] (PffBT4T-2OD), or Poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}) (PTB7-Th).

14. The optical fiber of claim 12, wherein the photovoltaic polymer is compounded with nanoparticles having enhanced infrared or near-infrared absorption.

15. The optical fiber of claim 14, wherein the nanoparticles are selected from at least one of CdSe, PbS, PbSe, fullerenes, Ni, NiCo, NiLa, NiS, NiLu, PbSe, an aminium radical cation, an anionic borate moiety, oxide semiconductor fine particles sensitized with a dye, triply linked porphyrin-tape dimers, fused hexacyclic nonfullerene acceptor, and IHIC.

* * * * *